United States Patent
Abe

(10) Patent No.: US 6,917,238 B2
(45) Date of Patent: Jul. 12, 2005

(54) FUSE CIRCUIT AND DISPLAY DRIVER CIRCUIT

(75) Inventor: Masaaki Abe, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/657,803

(22) Filed: Sep. 8, 2003

(65) Prior Publication Data

US 2004/0108882 A1 Jun. 10, 2004

(30) Foreign Application Priority Data

Sep. 10, 2002 (JP) .................................. 2002-264542

(51) Int. Cl.$^7$ ............................................. H01H 37/76
(52) U.S. Cl. ..................... 327/525; 345/98; 365/200
(58) Field of Search ................ 327/525, 526; 365/200, 225.7, 185.04, 230.06; 345/87–93, 98

(56) References Cited

U.S. PATENT DOCUMENTS

| | | | | |
|---|---|---|---|---|
| 5,596,535 A | * | 1/1997 | Mushya et al. ............. | 365/200 |
| 5,621,691 A | * | 4/1997 | Park ............................. | 365/200 |
| 5,668,818 A | * | 9/1997 | Bennett et al. ............. | 714/726 |
| 5,677,917 A | * | 10/1997 | Wheelus et al. ............ | 714/726 |

* cited by examiner

Primary Examiner—Minh Nguyen
(74) Attorney, Agent, or Firm—Hogan & Hartson, LLP

(57) ABSTRACT

A latch circuit fetches a setting state of a fuse element. A latch clock generation circuit generates a latch clock based on a cyclic signal (frame signal, for example). The latch circuit cyclically fetches the setting state of the fuse element based on the latch clock. An analog value is adjusted based on the setting state of the fuse element latched by the latch circuit.

7 Claims, 10 Drawing Sheets

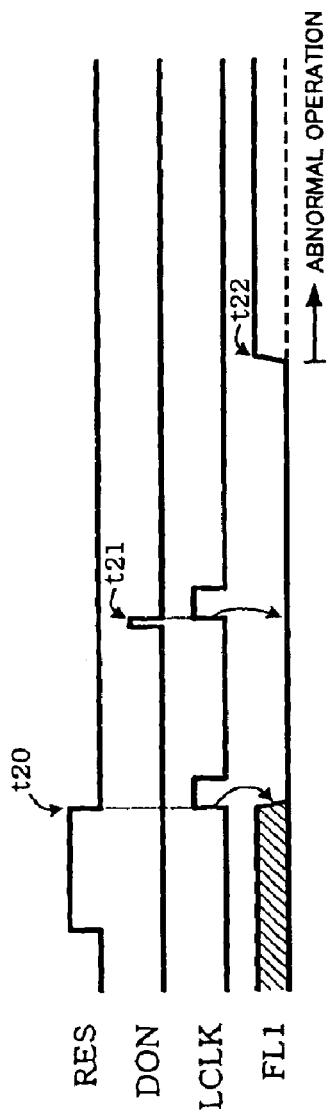
FIG. 4A  ABNORMAL OPERATION EXAMPLE
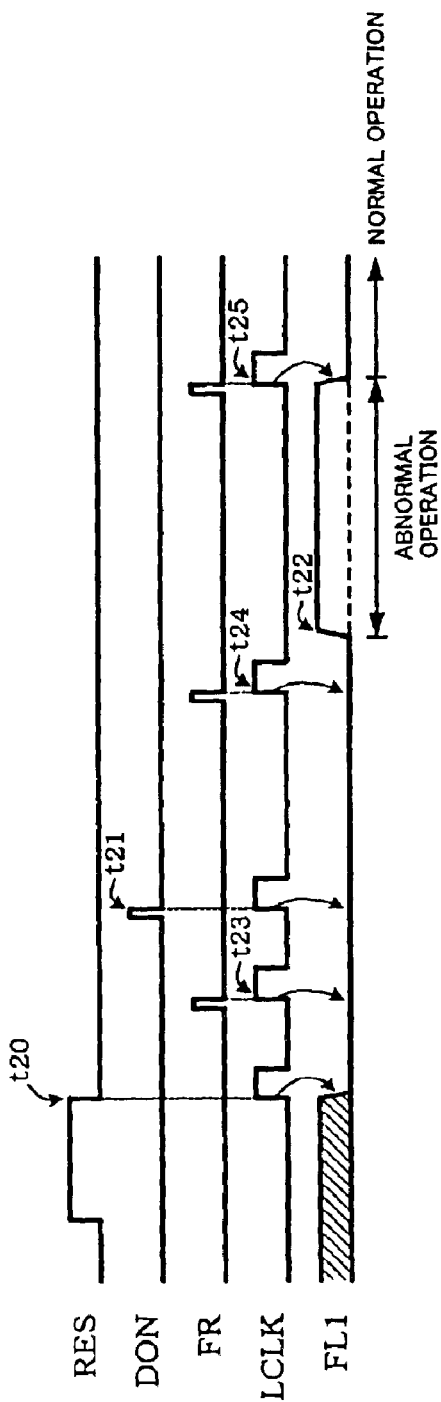
FIG. 4B  NORMAL OPERATION RESTORATION EXAMPLE

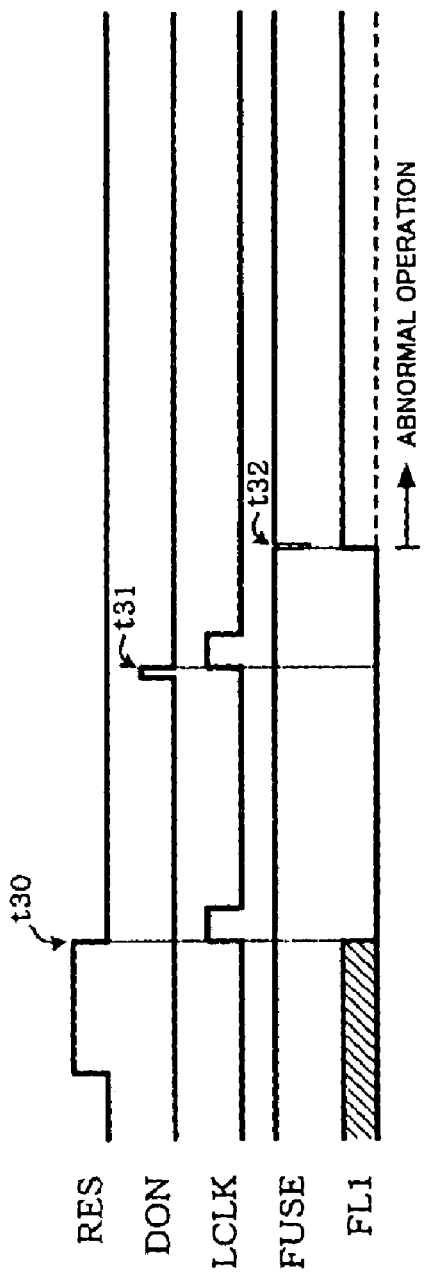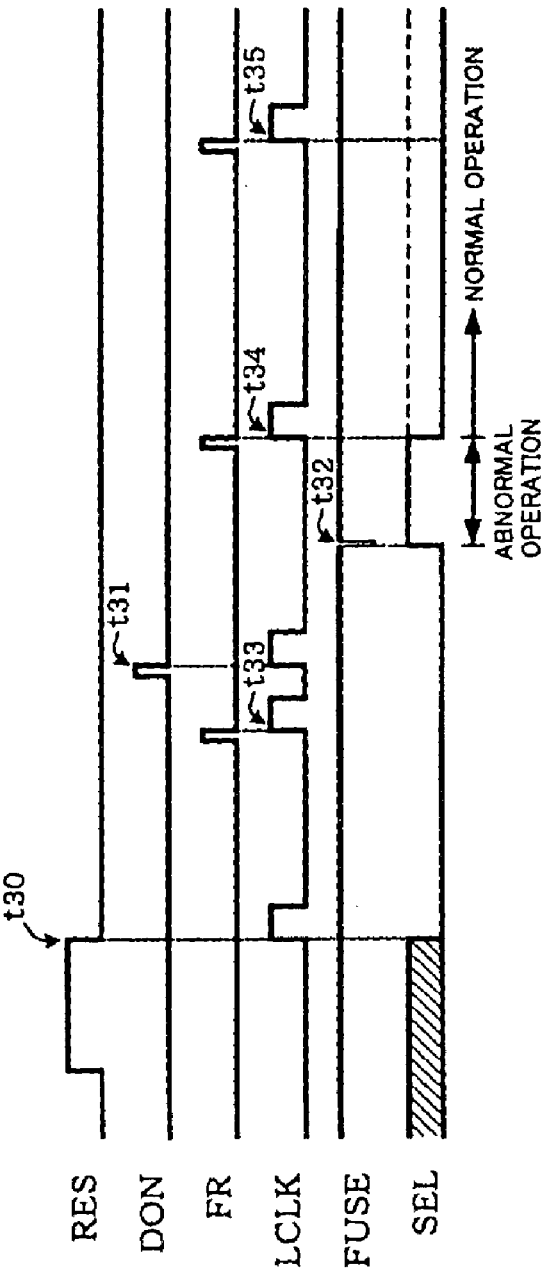
FIG. 5A ABNORMAL OPERATION EXAMPLE
FIG. 5B NORMAL OPERATION RESTORATION EXAMPLE

FUSE CIRCUIT AND DISPLAY DRIVER CIRCUIT

Japanese Patent Application No. 2002-264542 filed on Sep. 10, 2002, is hereby incorporated by reference in its entirety.

BACKGROUND OF THE INVENTION

The present invention relates to a fuse circuit and a display driver circuit.

In a semiconductor integrated circuit, there may be a case where a fuse circuit is used to absorb variation of process parameters caused by manufacturing variation. The fuse circuit enables a target analog value such as a current value, voltage value, or oscillation frequency in the circuit to be adjusted corresponding to a state set by a fusible fuse element.

BRIEF SUMMARY OF THE INVENTION

One aspect of the present invention relates to a fuse circuit for adjusting an analog value, comprising:

a latch circuit which stores a setting state of a fuse element; and a latch clock generation circuit which generates a latch clock based on a cyclic signal, the latch clock being used for fetching the setting state of the fuse element into the latch circuit, wherein the latch circuit cyclically fetches the setting state of the fuse element based on the latch clock, and wherein the analog value is adjusted based on the setting state of the fuse element fetched by the latch circuit.

Another aspect of the present invention relates to a fuse circuit for adjusting an analog value, comprising:

a plurality of latch circuits which store setting states of a plurality of fuse elements; and a latch clock generation circuit which generates a plurality of latch clocks of different phases corresponding to the respective latch circuits based on a cyclic signal, wherein each of the latch circuits cyclically fetches the setting state of the corresponding one of the fuse elements based on the corresponding one of the latch clocks, and wherein the analog value is adjusted based on the setting states of the fuse elements fetched by the latch circuits.

BRIEF DESCRIPTION OF THE SEVERAL VIEWS OF THE DRAWING

FIG. 4A shows an example of a timing chart in the case where an abnormal operation due to a change in the content of fuse latch data; and FIG. 4B shows an example of a timing chart in the case where a normal operation is restored by using a cyclic signal after the content of fuse latch data is changed.

FIG. 5A shows an example of a timing chart in the case where an abnormal operation occurs due to application of noise to a test mode setting signal; and FIG. 5B shows an example of a timing chart in the case where a normal operation is restored by using a cyclic signal after noise is applied to a test mode setting signal.

DETAILED DESCRIPTION OF THE EMBODIMENT

Embodiments of the present invention are described below. Note that the embodiments described hereunder do not in any way limit the scope of the invention defined by the claims laid out herein. Note also that all of the elements described hereunder should not be taken as essential requirements of the present invention.

A display driver circuit which drives a liquid crystal panel (display panel) needs a highly accurate liquid crystal drive voltage in order to perform highly accurate image display, for example. However, it is difficult to generate an optimum liquid crystal drive voltage due to type variation of the liquid crystal material for the liquid crystal panel, manufacturing variation of the display driver circuit, and the like. Therefore, optimum image display is realized by generating a state corresponding to setting states of fuse elements by using a fuse circuit, and finely adjusting the liquid crystal drive voltage corresponding to the generated state.

However, there may be a case where the content which holds the setting state of the fuse element is changed due to external noise such as static electricity depending on the configuration of the fuse circuit.

According to the following embodiments, a fuse circuit which can be prevented from being affected by external noise without increasing the circuit scale, and a display driver circuit including the same can be provided.

The embodiments of the present invention are described below in detail with reference to the drawings.

Figure 1:
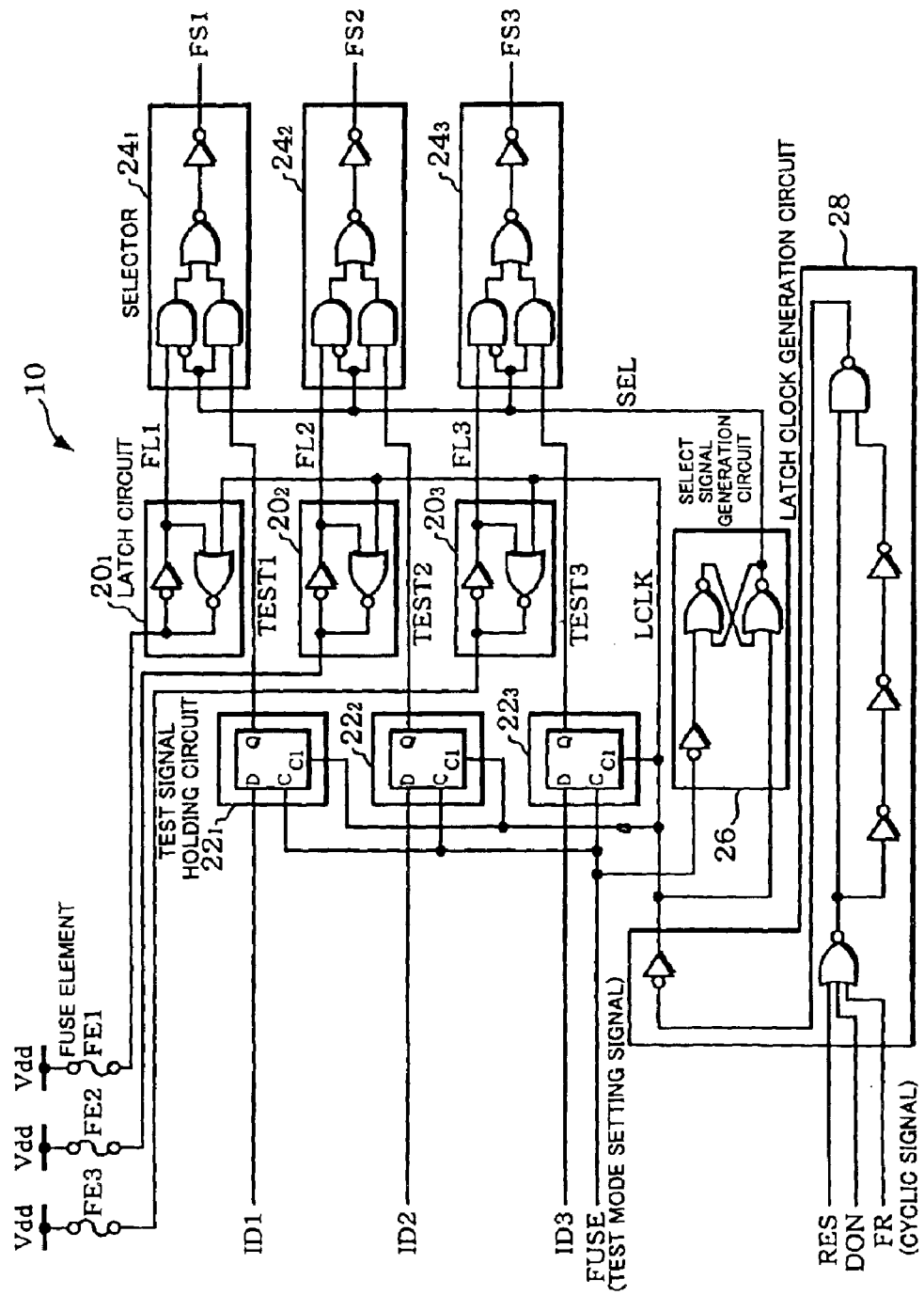
FIG. 1 is a circuit diagram showing an example of a configuration of a fuse circuit in an embodiment of the present invention.

FIG. 1 shows an example of a configuration of a fuse circuit in the present embodiment.

The following description illustrates the case where the fuse circuit uses fuse elements for three bits. However, the same description is applied to the case where the number of bits is two or four or more.

A fuse circuit 10 holds setting states of fuse elements generated by using fuse elements FE1 to FE3. Each fuse element is blown (fused and cut) by applying a given high voltage between both ends of the fuse element, for example.

The fuse circuit 10 may include latch circuits $20_1$ to $20_3$, test signal holding circuits $22_1$ to $22_3$, and selectors $24_1$ to $24_3$.

One end of each fuse element is connected with a (system) power supply which supplies a power supply voltage Vdd. The latch circuit is connected with the other end of each fuse element. Therefore, the voltage on the other end of the fuse element is approximately equal to the power supply voltage Vdd in a state in which the fuse element is not blown.

The latch circuits $20_1$ to $20_3$ fetch logic levels corresponding to the voltages on the other ends of the fuse elements FE1 to FE3 (setting states of the fuse elements in a broad sense), and output fuse latch data FL1 to FL3. The latch circuits $20_1$ to $20_3$ fetch logic levels corresponding to the voltages on the other ends (terminals which are not connected with the system power supply) of the fuse elements FE1 to FE3.

The latch circuit $20_1$ holds a logic level "H" in a state in which the fuse element FE1 is not blown, and outputs a logic level "L" as the fuse latch data FL1. In a state in which the fuse element FE1 is blown, the latch circuit $20_1$ holds a logic level "L" corresponding to the voltage on the other end of the fuse element FE1 in an open state, and outputs a logic level "H" as the fuse latch data FL1. The latch circuits $20_2$ and $20_3$ hold logic levels corresponding to the states of the fuse elements FE2 and FE3, respectively, in the same manner as the latch circuit $20_1$.

The fuse elements FE1 to FE3 cannot be restored once the fuse elements FE1 to FE3 are blown. In the fuse circuit 10, states equivalent to the states when the fuse elements FE1 to FE3 are blown can be created in advance by using test signals ID1 to ID3 for confirming whether or not an analog value adjusted corresponding to the setting states of the fuse elements FE1 to FE3 can be allowed. The test signal holding circuits $22_1$ to $22_3$ hold the test signals ID1 to ID3 based on a test mode setting signal FUSE, and output test latch data TEST1 to TEST3. The selectors $24_1$ to $24_3$ select the test latch data TEST1 to TEST3 instead of the fuse latch data FL1 to FL3 based on a select signal SEL, and output the test latch data TEST1 to TEST3 as fuse circuit output signals FS1 to FS3.

The analog value is adjusted corresponding to one of eight states specified by the fuse circuit output signals FS1 to FS3. This enables eight patterns of fine adjustment to be performed corresponding to the setting states of the fuse elements. Moreover, a test state equivalent to the setting state can be created in advance. The fuse circuit 10 may be set to the test state by changing the state by using the select signal SEL generated using the test mode setting signal FUSE.

In more detail, the fuse circuit 10 includes a select signal generation circuit 26 which generates the select signal SEL. The select signal generation circuit 26 includes an RS flip-flop. The RS flip-flop generates the select signal SEL by using an inverted signal of the test mode setting signal FUSE as a set signal and a latch clock LCLK as a reset signal.

The fuse circuit 10 includes a latch clock generation circuit 28 which generates the latch clock LCLK. The latch clock generation circuit 28 includes a rising edge detection circuit. The latch clock generation circuit 28 generates the latch clock LCLK having a pulse width corresponding to a delay time for three stages of inverters based on a rising edge of an input signal.

In the case of applying the fuse circuit to a display driver circuit which drives a liquid crystal panel, the latch clock generation circuit 28 generates the latch clock LCLK when the logic level of a reset signal RES or a display on signal DON is changed to "L" from "H". The reset signal RES is a signal which goes active by hardware reset, and becomes a pulse signal at a logic level "H". The display on signal DON is a signal which goes active corresponding to a command that clears the content of a display data RAM or the like in a refresh sequence performed by software (firmware), and becomes a pulse signal at a logic level "H".

Figure 2:
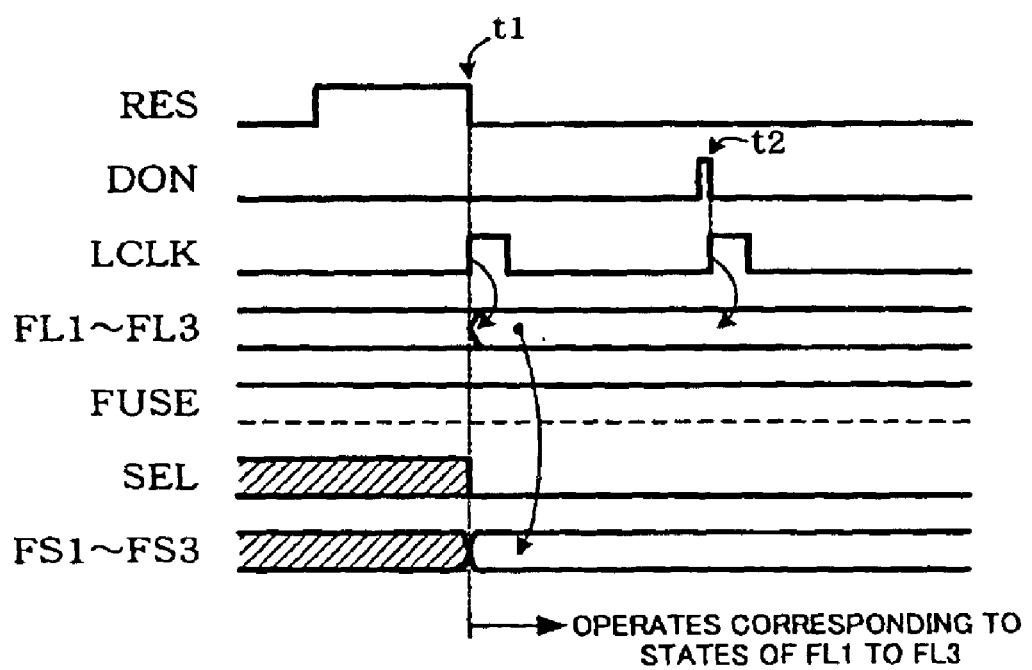
FIG. 2 is a timing chart of an example of operation timing of a fuse circuit.

FIG. 2 shows an example of operation timing of the fuse circuit 10.

FIG. 2 illustrates the case where the fuse circuit 10 does not transition to the test mode since the logic level of the test mode setting signal FUSE remains "H".

In the fuse circuit 10, one or more of the fuse elements FE1 to FE3 are blown, and the setting states of the fuse elements are held in the latch circuits $20_1$ to $20_3$. The latch circuits $20_1$ to $20_3$ output the fuse latch data FL1 to FL3 corresponding to the content held in the latch circuits $20_1$ to $20_3$.

The logic level of the reset signal RES becomes "H" by hardware reset and then becomes "L" (t1). At the time t1, the latch clock LCLK is generated by the latch clock generation circuit 28. The latch circuits $20_1$ to $20_3$ fetch the logic levels corresponding to the voltages on the other ends of the fuse elements FE1 to FE3 by using the latch clock LCLK. The select signal generation circuit 26 sets the select signal SEL at a logic level "L". Therefore, the selectors $24_1$ to $24_3$ select the fuse latch data FL1 to FL3 held in the latch circuits $20_1$ to $20_3$, and output the fuse latch data FL1 to FL3 as the fuse circuit output signals FS1 to FS3. A target analog value is adjusted by using the fuse latch data FL1 to FL3.

The logic level of the display on signal DON becomes "H" by the display on command executed by the user and then becomes "L" (t2). At the time t2, the latch clock LCLK is generated by the latch clock generation circuit 28. The latch circuits $20_1$ to $20_3$ fetch the logic levels corresponding to the voltages on the other ends of the fuse elements FE1 to FE3 by using the latch clock LCLK.

Figure 3:
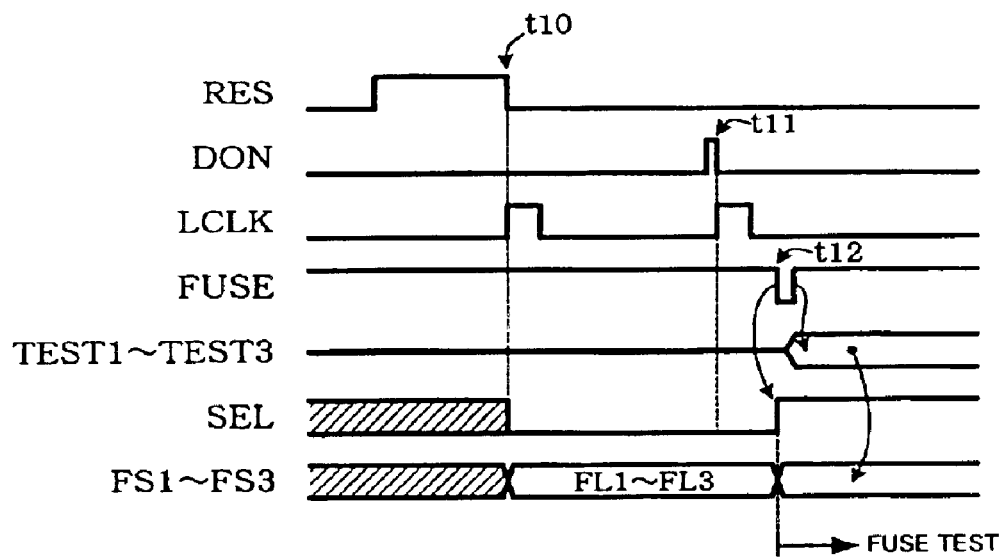
FIG. 3 is a timing chart of another example of operation timing of a fuse circuit.

FIG. 3 shows another example of operation timing of the fuse circuit 10.

FIG. 3 illustrates the case where the fuse circuit 10 transitions to the test mode in response to input of a pulse of the test mode setting signal FUSE at a logic level "L".

In the fuse circuit 10, one or more of the fuse elements FE1 to FE3 are blown, and the setting states of the fuse elements are held in the latch circuits $20_1$ to $20_3$. The latch circuits $20_1$ to $20_3$ output the fuse latch data FL1 to FL3 corresponding to the content held in the latch circuits $20_1$ to $20_3$.

The logic level of the reset signal RES becomes "H" by hardware reset and then becomes "L" (t10). At the time t10, the latch clock LCLK is generated by the latch clock generation circuit 28. The latch circuits $20_1$ to $20_3$ fetch the logic levels corresponding to the voltages on the other ends of the fuse elements FE1 to FE3 by using the latch clock LCLK. The select signal generation circuit 26 sets the select signal SEL at a logic level "L". Therefore, the selectors $24_1$ to $24_3$ select the fuse latch data FL1 to FL3 held in the latch circuits $20_1$ to $20_3$, and output the fuse latch data FL1 to FL3 as the fuse circuit output signals FS1 to FS3.

The logic level of the display on signal DON becomes "H" by the display on command executed by the user and then becomes "L" (t11). At the time t11, the latch clock LCLK is generated by the latch clock generation circuit 28. The latch circuits $20_1$ to $20_3$ fetch the logic levels corresponding to the voltages on the other ends of the fuse elements FE1 to FE3 by using the latch clock LCLK.

When the pulse of the test mode setting signal FUSE is input and the fuse circuit 10 transitions to the test mode (t12), the test signals ID1 to ID3 are latched by the test signal holding circuit $22_1$ to $22_3$ at a rising edge of the test mode setting signal FUSE. The test signal holding circuits $22_1$ to $22_3$ output the test latch data TEST1 to TEST3. The select signal generation circuit 26 sets the select signal SEL at a logic level "H". Therefore, the selectors $24_1$ to $24_3$ select the test latch data TEST1 to TEST3 held in the test signal holding circuits $22_1$ to $22_3$, and output the test latch data TEST1 to TEST3 as the fuse circuit output signals FS1 to FS3. This allows a target analog value to be adjusted by using the test latch data TEST1 to TEST3 (fuse test).

In the fuse circuit 10 in the present embodiment, a cyclic signal (frame signal FR in FIG. 1) is input to the latch clock generation circuit 28 in addition to the reset signal RES and the display on signal DON, as shown in FIG. 1. In the present embodiment, the setting states of the fuse elements are fetched by the latch circuits $20_1$ to $20_3$ by using the latch clock LCLK generated by using the cyclic signal. The frame signal FR is a signal which changes for each frame. A voltage applied to a liquid crystal is inverted by using the frame signal FR, or an alternating signal (polarity inversion signal) which inverts the voltage applied to the liquid crystal is generated based on the frame signal FR.

The reason why the cyclic signal is necessary for the latch clock generation circuit 28 in the fuse circuit 10 is described below with reference to FIGS. 4A, 4B, 5A, and 5B.

FIG. 4A shows an example of a timing chart in the case where an abnormal operation occurs due to a change in the content of the fuse latch data FL1. FIG. 4B shows an example of a timing chart in the case where a normal operation is restored by using the cyclic signal after the content of the fuse latch data FL1 is changed. FIGS. 4A and 4B illustrate only the fuse latch data FL1. However, the same description is applied to the fuse latch data FL2 and FL3.

In FIG. 4A, the pulse of the reset signal RES is generated by hardware reset (t20). The pulse of the display on signal DON is generated by the display on command executed by the user (t21), and the latch circuits $20_1$ to $20_3$ fetch the logic levels corresponding to the voltages on the other ends of the fuse elements FE1 to FE3 by using the latch clock LCLK. These operations are the same as the operations shown in FIG. 2. Therefore, further description is omitted.

There may be a case where external noise such as static electricity is applied to the other end of the fuse element FE1 in an open state after occurrence of the pulse of the display on signal DON, whereby the content held in the latch circuit $20_1$ is changed (t22). This causes the logic level of the fuse latch data FL1 to be changed to "H" from "L". Therefore, an analog value to be adjusted is changed by the fuse circuit output signal FS1 output by allowing the selector $24_1$ to select the fuse latch data FL1, thereby causing an abnormal operation to occur.

In the present embodiment shown in FIG. 4B, the latch clock LCLK is cyclically generated by using the frame signal FR even after the pulse of the display on signal DON is generated (t23, t24, and t25). Therefore, the setting state of the fuse element is fetched by the latch circuit by using the latch clock LCLK generated at the times t23, t24, and t25. Therefore, the setting state of the fuse element FE1 is fetched by the latch circuit $20_1$ by using the latch clock LCLK generated at the time t25 after the abnormal operation occurrence time t22 shown in FIG. 4A. This allows the content held in the latch circuit $20_1$ to be returned to a logic level "H" and the fuse latch data FL1 to be returned to a logic level "L", whereby a normal operation can be restored.

FIG. 5A shows an example of a timing chart in the case where an abnormal operation occurs due to application of noise to the test mode setting signal FUSE. FIG. 5B shows an example of a timing chart in the case where a normal operation is restored by using the cyclic signal after noise is applied to the test mode setting signal FUSE.

In FIG. 5A, the pulse of the reset signal RES is generated by hardware reset (t30). The pulse of the display on signal DON is generated by the display on command executed by the user (t31), and the test latch data TEST1 to TEST3 held in the test signal holding circuits $22_1$ to $22_3$ is output as the fuse circuit output signals FS1 to FS3. These operations are the same as the operations shown in FIG. 3. Therefore, further description is omitted.

There may be a case where external noise such as static electricity is applied to the test mode setting signal FUSE after the pulse of the display on signal DON is generated, whereby the test mode setting signal FUSE is set at a logic level "L" (t32). This causes the logic level of the select signal SEL to be changed to "H" from "L" in the select signal generation circuit 26. Therefore, the test latch data TEST1 to TEST3 is output from the selectors $24_1$ to $24_3$ as the fuse circuit output signals FS1 to FS3 although it is not intended to allow the fuse circuit to transition to the test mode, whereby an analog value to be adjusted is changed. This causes an abnormal operation to occur.

In the present embodiment shown in FIG. 5B, the latch clock LCLK is cyclically generated by using the frame signal FR even after the pulse of the display on signal DON is generated (t33, t34, and t35). Therefore, the logic level of the select signal SEL generated by the select signal generation circuit 26 is returned to "L" by using the latch clock LCLK generated at the time t35 after the abnormal operation occurrence time t32 shown in FIG. 5A. This prevents the test latch data TEST1 to TEST3 from being output as the fuse circuit output signals FS1 to FS3, whereby a normal operation is restored.

Since the latch clock LCLK is generated by using the cyclic signal, the above-described abnormal operation can be prevented irrespective of the execution timing of the display on command which is dependent on the user after the hardware reset.

Figure 6:
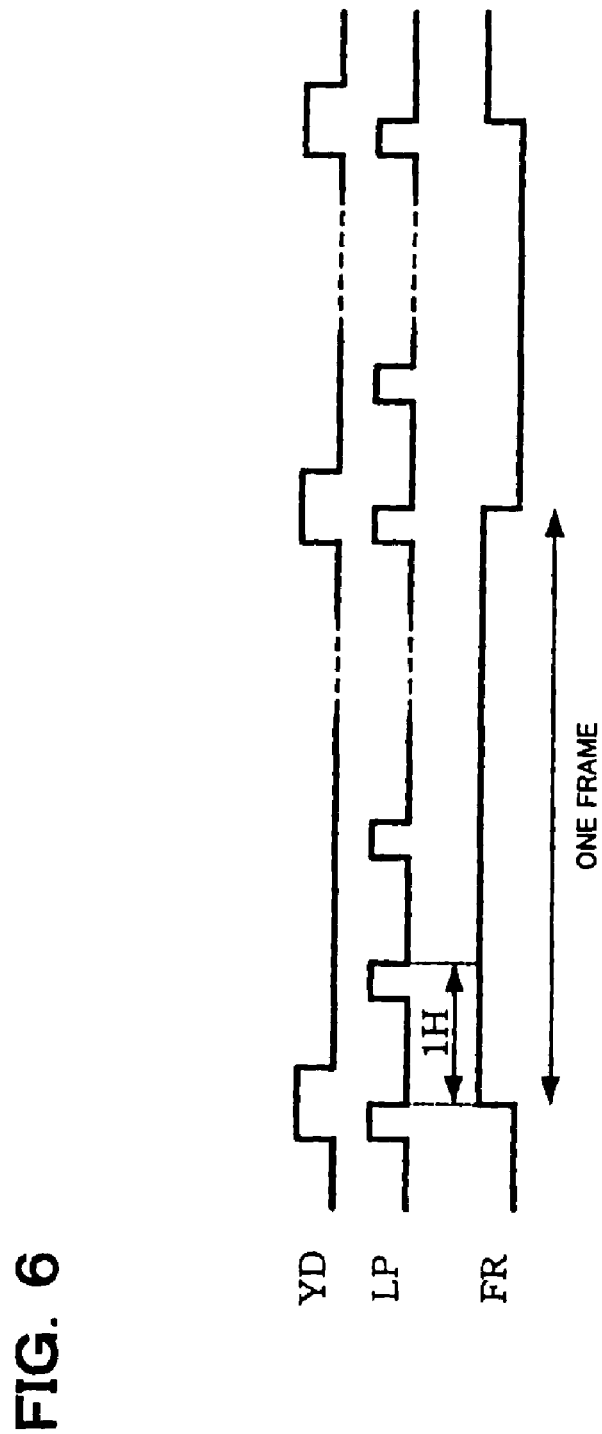
FIG. 6 is a view showing another example of a cyclic signal.

The cyclic signal is not limited to the frame signal FR shown in FIG. 1. As other examples of the cyclic signals, a start pulse signal YD, a latch pulse signal LP, and a charge-pump clock shown in FIG. 6 can be given. The start pulse signal YD is a pulse signal which indicates start of the frame. The latch pulse LP is a signal which specifies one horizontal scanning period. The charge-pump clock is a timing signal necessary for a charge-pump booster circuit which generates a high voltage necessary for driving the liquid crystal panel.

The cyclic signal is preferably a long cycle signal rather than a short cycle internal clock. This is because power consumption is reduced when allowing the latch circuit to fetch the setting state of the fuse element if the frequency of occurrence of shoot-through current is small.

Figure 7:
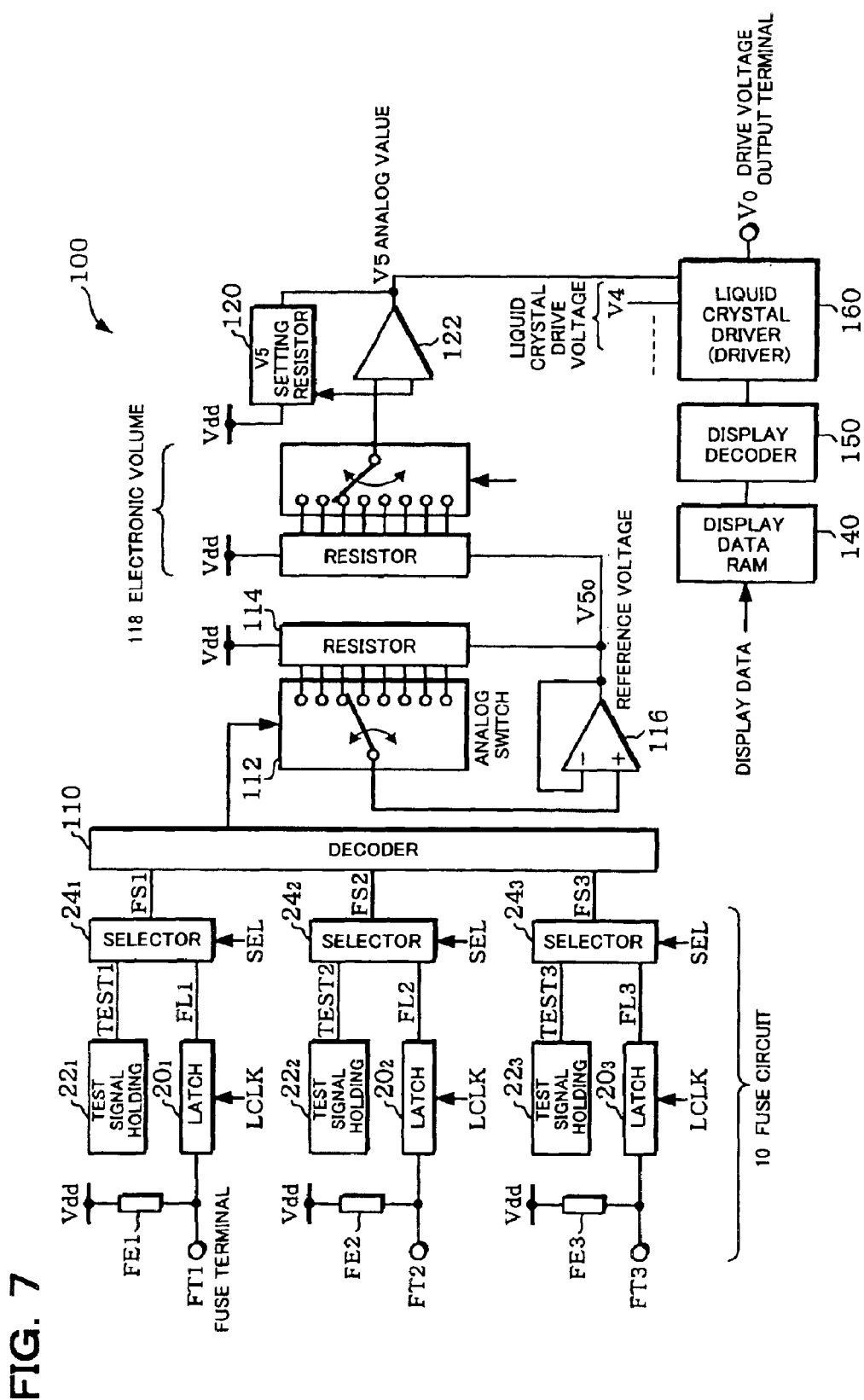
FIG. 7 is a block diagram showing an outline of a configuration of a display driver circuit to which a fuse circuit is applied.

FIG. 7 shows an outline of a configuration of a display driver circuit to which the fuse circuit 10 is applied.

In FIG. 7, sections the same as those of the fuse circuit 10 shown in FIG. 1 are indicated by the same symbols. Description of these sections is appropriately omitted.

FIG. 7 illustrates the case where the fuse circuit 10 is used to finely adjust a liquid crystal drive voltage V5 (analog value). A fuse circuit similar to the fuse circuit 10 may be used for each analog value to be adjusted such as a liquid crystal drive voltage V4. FIG. 7 illustrates the case where the analog value is adjusted by using three bits. However, the number of bits is not limited thereto.

One end of each of the fuse elements FE1 to FE3 is connected with a system power supply. The other end of each of the fuse elements FE1 to FE3 is connected with fuse terminals (external terminals in a broad sense) FT1 to FT3. A high voltage is applied between both ends of the fuse element FE1 by supplying a voltage to the fuse terminal FT1, whereby the fuse element FE1 is blown. The fuse elements FE2 and FE3 can be blown by supplying a voltage to the fuse terminals FT2 and FT3.

The fuse circuit output signals FS1 to FS3 generated by the fuse circuit 10 are input to a decoder 110. The decoder 110 decodes 3-bit data indicated by the fuse circuit output signals FS1 to FS3 to generate a switch control signal for an analog switch (SW) 112.

A resistor dividing ratio of a resistor circuit 114 is determined by switch control of the analog SW 112. Therefore, an output voltage of a voltage-follower-connected operational amplifier circuit 116 can be adjusted to a reference voltage $V5_0$ (−2.1 V, for example) with high accuracy.

The liquid crystal drive voltage V5 (analog value in a broad sense) can be finely adjusted based on the reference voltage $V5_0$ by switch control of software by using an electronic volume (VR) 118, a V5 setting resistor 120, and an operational amplifier circuit 122.

The display driver circuit 100 may include a display data RAM 140, a display decoder circuit 150, and a liquid crystal driver circuit (driver circuit in a broad sense) 160. The display data RAM 140 stores display data for one frame, for example. The display decoder circuit 150 decodes and outputs the display data corresponding to display timing and a display pattern for driving display by using multi line selection (MLS), for example. The liquid crystal driver circuit 160 outputs the liquid crystal drive voltage (V5, V4, etc.) corresponding to the decoded result to a drive voltage output terminal (external terminal in a broad sense) $V_O$.

In the case of applying the fuse circuit 10 in the present embodiment to the display driver circuit in this manner, the setting states of the fuse elements can be cyclically fetched merely by applying the cyclic signal necessary for display control. Therefore, an analog value can be finely adjusted by using the fuse elements without increasing the circuit scale and without being affected by external noise.

Figure 8:
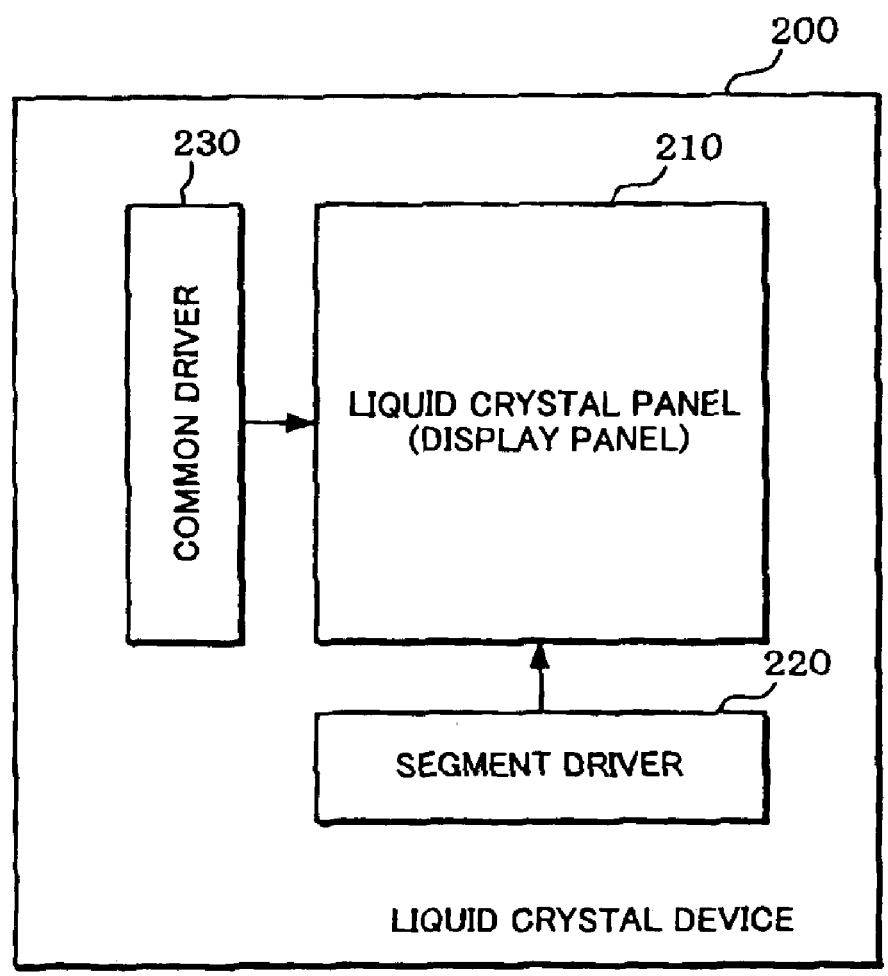
FIG. 8 is a block diagram showing an outline of a configuration of a liquid crystal device.

The display driver circuit 100 may be applied to a segment driver of a liquid crystal device 200 shown in FIG. 8. The liquid crystal device 200 shown in FIG. 8 includes a matrix panel including an electro-optical element such as a color liquid crystal panel (display panel in a broad sense) 210, a segment driver 220 with a built-in RAM which drives the liquid crystal panel 210, and a scanning common driver 230.

There are no specific limitations to the liquid crystal panel 210 insofar as the liquid crystal panel 210 utilizes an electro-optical element such as a liquid crystal of which the optical characteristics are changed by applying voltage. The liquid crystal panel 210 may be a simple matrix panel, for example. In this case, a liquid crystal is sealed between a first substrate on which a plurality of segment electrodes (first electrodes) are formed and a second substrate on which a plurality of common electrodes (second electrodes) are formed. The liquid crystal panel 210 may be an active matrix panel using a three terminal element such as a thin film transistor (TFT) or a two terminal element such as a thin film diode (TFD). The active matrix panel also includes a plurality of signal electrodes (first electrodes) driven by the segment driver 220 with a built-in RAM, and a plurality of scanning electrodes (second electrodes) scanned by the common driver 230.

A highly accurate image display can be realized by a liquid crystal drive voltage which is adjusted with high accuracy by using the display driver circuit 100 in the liquid crystal device 200.

Modification

In FIG. 1, shoot-through current flows each time the content held in the latch circuits $20_1$ to $20_3$ having a configuration in which complementary states are held at two nodes is updated. Therefore, in the case where the content held in all the latch circuits $20_1$ to $20_3$ is updated by using the latch clock LCLK, there may be a case where noise occurs due to shoot-through current flowing at the same time.

In a fuse circuit in this modification, latch clocks are generated for a plurality of latch circuits which hold setting states of a plurality of fuse elements in units of one or a plurality of latch circuits. The latch clocks are generated so as to differ in phase. This prevents the content held in all the latch circuits from being updated at the same time, whereby shoot-through current can be reduced and occurrence of noise can be prevented.

Figure 9:
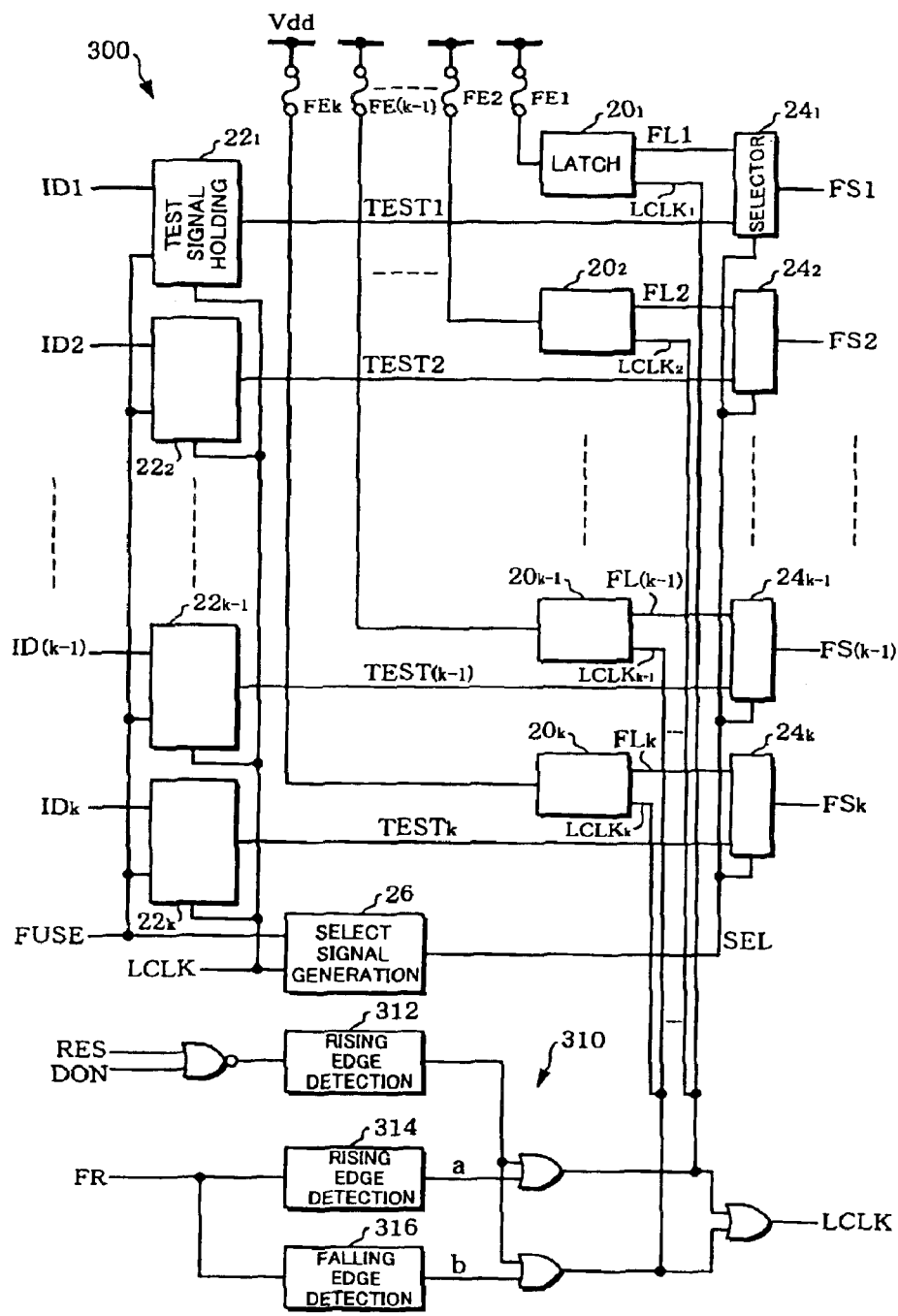
FIG. 9 is a circuit diagram showing an example of a configuration of a fuse circuit in a modification.

FIG. 9 shows an example of a configuration of a fuse circuit in this modification.

In FIG. 9, sections the same as those of the fuse circuit 10 shown in FIG. 1 are indicated by the same symbols. Description of these sections is appropriately omitted.

A fuse circuit 300 in this modification differs from the fuse circuit 10 shown in FIG. 1 in that the fuse circuit 300 includes latch circuits $20_1$ to $20_k$ which hold setting states of a plurality of fuse elements FE1 to FEk (k is an integer of two or more), and the latch clocks of different phases are generated for the latch circuits $20_1$ to $20_k$ in units of one or more latch circuits. In FIG. 9, the latch clocks $LCLK_1$ to $LCLK_k$ are supplied to the latch circuits $20_1$ to $20_k$. The latch clock LCLK is output as the result of logical OR of the latch clocks $LCLK_1$ to $LCLK_k$.

A latch clock generation circuit 310 includes rising edge detection circuits (differentiation circuits in a broad sense) 312 and 314 and a falling edge detection circuit (differentiation circuit in a broad sense) 316. The rising edge detection circuit 312 detects a rising edge of a signal output from a two-input, one-output NOR circuit to which the reset signal RES and the display on signal DON are input, and outputs a pulse signal in synchronization with the rising edge. The rising edge detection circuit 314 detects a rising edge of the frame signal FR (cyclic signal in a broad sense), and outputs a pulse signal a in synchronization with the rising edge of the frame signal FR. The falling edge detection circuit 316 detects a falling edge of the frame signal FR, and outputs a pulse signal b in synchronization with the falling edge of the frame signal FR.

Figure 10:
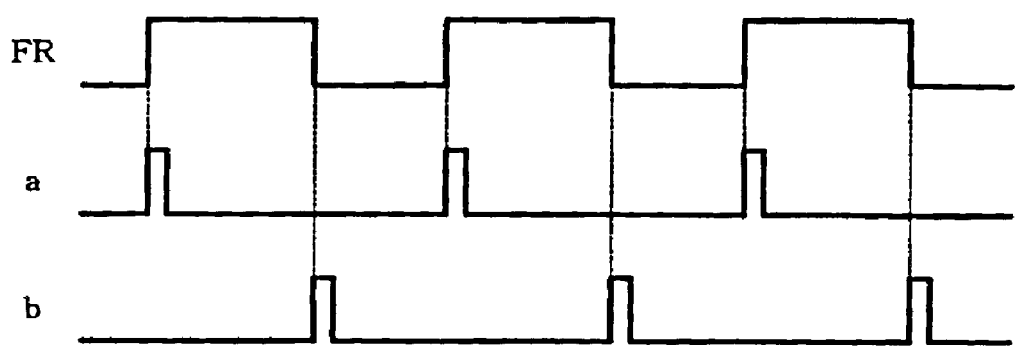
FIG. 10 is a timing chart of pulse signals generated by using a frame signal in a modification.

FIG. 10 shows a timing chart of the pulse signals a and b generated by using the frame signal FR.

The pulse signal a is generated in synchronization with the rising edge of the frame signal FR. The pulse signal b is generated in synchronization with the falling edge of the frame signal FR. Since the rising edge detection circuit 314 and the falling edge detection circuit 316 can be formed by using a delay element and a logic circuit, the latch clocks of different phases can be generated by using an extremely simple configuration.

The logical OR of the pulse signal output from the rising edge detection circuit 312 and the pulse signal a becomes the latch clocks LCLK1, LCLK2, . . . , and LCLKm (m is a positive integer of less than k), for example. The logical OR of the pulse signal output from the rising edge detection circuit 312 and the pulse signal b becomes the latch clocks LCLK(m+1), . . . , LCLK(k−1), and LCLKk, for example. Specifically, the pulse signals a and b are supplied to the latch circuits as the latch clocks. In FIG. 9, the content held in the latch circuits $20_1$ to $20_k$ is updated by two types of latch clocks of different phases.

In the case of supplying the latch clocks of different phases to each of the latch circuits $20_1$ to $20_k$, power consumption of the circuit can be reduced since occurrence of shoot-through current can be minimized. In the case of supplying the latch clocks of different phases in units of a plurality of the latch circuits $20_1$ to $20_k$, since the types of latch clocks can be reduced, the configuration of the latch clock generation circuit can be simplified, whereby the fuse circuit can be manufactured at low cost.

According to this modification, the content held in the latch circuits is updated by using the latch clocks of at least two phases instead of updating the content held in the latch circuits at the same time. This enables shoot-through current occurring when updating the content held in the latch circuits to be reduced, whereby occurrence of noise caused by shoot-through current can be prevented.

The fuse circuit 300 in this modification may be applied to the display driver circuit shown in FIG. 7 and the segment driver shown in FIG. 8 in the same manner as the fuse circuit 10 shown in FIG. 1. The configuration and the operation of the fuse circuit 300 are the same as those of the fuse circuit 10 shown in FIG. 1.

The present invention is not limited to the above-described embodiment. Various modifications are possible within the spirit and scope of the present invention.

The configurations of the latch circuit, the selector circuit, the test signal holding circuit, the select signal generation circuit, and the latch clock generation circuit are not limited to the configurations shown in FIG. 1 or 9.

Part of requirements of any claim of the present invention could be omitted from a dependent claim which depends on that claim. Moreover, part of requirements of any independent claim of the present invention could be made to depend on any other independent claim.

The following features are disclosed relating to the configuration of the above-described embodiment.

One embodiment of the present invention relates to a fuse circuit for adjusting an analog value, comprising:

a latch circuit which stores a setting state of a fuse element; and a latch clock generation circuit which generates a latch clock based on a cyclic signal, the latch clock being used for fetching the setting state of the fuse element into the latch circuit, wherein the latch circuit cyclically fetches the setting state of the fuse element based on the latch clock, and wherein the analog value is adjusted based on the setting state of the fuse element fetched by the latch circuit.

The setting state of the fuse element may be a logic level corresponding to a voltage on one end of the fuse element that can be fused and cut, for example.

In this fuse circuit, the setting state of the fuse element is fetched by the latch circuit. The setting state of the fuse element is cyclically fetched by the latch circuit by allowing the latch circuit to fetch the setting state of the fuse element by using the latch clock generated based on the cyclic signal. This enables the content held in the latch circuit to be cyclically updated even in the case where the content held in he latch circuit is changed due to external noise such as static electricity. Therefore, even if an abnormal operation occurs when the analog value is erroneously adjusted based on the content of the latch circuit, a normal operation based on the analog value adjusted to a suitable value can be restored.

Another embodiment of the present invention relates to a fuse circuit for adjusting an analog value, comprising:

a plurality of latch circuits which store setting states of a plurality of fuse elements; and a latch clock generation circuit which generates a plurality of latch clocks of different phases corresponding to the respective latch circuits based on a cyclic signal, wherein each of the latch circuits cyclically fetches the setting state of the corresponding one of the fuse elements based on the corresponding one of the latch clocks, and wherein the analog value is adjusted based on the setting states of the fuse elements fetched by the latch circuits.

According to this fuse circuit, since the latch clocks of different phases are supplied to the latch circuits, the contents of the latch circuits which hold the setting states of the fuse elements are not updated at the same time. Therefore, power consumption can be reduced by reducing shoot-through current which flows when updating the contents of the latch circuits. Moreover, occurrence of noise caused by shoot-through current can be prevented.

In this fuse circuit, the latch clock generation circuit may generate the latch clocks of different phases in units of a plural number of the latch circuits based on the cyclic signal.

According to this fuse circuit, since the types of the latch clocks can be reduced, the circuit can be simplified.

In this fuse circuit, the latch clocks may be generated in synchronization with a rising edge and a falling edge of the cyclic signal.

According to this fuse circuit, since the latch clocks of different phases can be generated by using an extremely simple configuration, cost of the circuit can be reduced.

In any of these fuse circuits, the cyclic signal may be a signal which changes for each frame.

According to this fuse circuit, in the case of applying the fuse circuit to a display control circuit, since a signal characteristic of display control which changes for each frame can be applied, an increase in circuit scale can be prevented. Moreover, the frequency of updating the content of the latch circuit can be reduced in comparison with a short cycle internal clock. This reduces shoot-through current which flows when updating the content depending on the configuration of the latch circuit, whereby power consumption can be reduced.

Any of these fuse circuits may include:

a test signal holding circuit which holds a test signal for testing the setting state of the fuse element;

a selector which selectively outputs one of the test signal held in the test signal holding circuit and the setting state of the fuse element fetched by the latch circuit based on a select signal; and a select signal generation circuit which generates the select signal based on a test mode setting signal and the latch clock, wherein the select signal generation circuit generates the select signal so that the selector selectively outputs the setting state of the fuse element fetched by the latch circuit when the latch clock is input.

According to this fuse circuit, even in the case where the test mode setting signal for testing the setting state of the fuse element is changed due to external noise such as static electricity and the test mode is erroneously set, the selector can be allowed to selectively output the setting state of the fuse element fetched by the latch circuit. Therefore, even in the case where the test mode is set for the above-described reason, the fuse circuit can be restored to a normal operation.

Still another embodiment of the present invention relates to a display driver circuit including one of the above fuse circuits and a driver circuit which drives a display panel based on a voltage value or a current value adjusted by the fuse circuit and based on the cyclic signal.

According to this display driver circuit, the setting state of the fuse element can be cyclically fetched merely by applying the cyclic signal necessary for display control. Therefore, display drive which enables highly accurate image display can be realized by finely adjusting the analog value such as the voltage value by using the fuse element without increasing the circuit scale and without being affected by external noise such as static electricity.

What is claimed is:

1. A fuse circuit used for adjusting an analog value based on a setting state of a fuse element, comprising:

a latch circuit which stores the setting state of a fuse element, a latch clock generation circuit which generates a latch clock based on a cyclic signal, the latch clock being used for fetching the setting state of the fuse element into the latch circuit, a test signal holding circuit which holds a test signal for testing the setting state of the fuse element;

a selector which selectively outputs one of the test signal held in the test signal holding circuit and the setting state of the fuse element fetched by the latch circuit based on a select signal; and a select signal generation circuit which generates the select signal based on a test mode setting signal and the latch clock, wherein the latch circuit cyclically fetches the setting state of the fuse element based on the latch clock, and wherein the select signal generation circuit generates the select signal so that the selector selectively outputs the setting state of the fuse element fetched by the latch circuit when the latch clock is input, and wherein the analog value is adjusted by the latch circuit based on the setting state of the fuse element fetched by the latch circuit.

2. The fuse circuit as defined in claim 1, wherein the analog value is a current value, voltage value, or oscillation frequency.

3. A fuse circuit used for adjusting an analog value based on a setting state of a fuse element, comprising:

a latch circuit which stores the setting state of a fuse element;

a latch clock generation circuit which generates a latch clock based on a cyclic signal, the latch clock being used for fetching the setting state of the fuse element into the latch circuit, a test signal holding circuit which holds a test signal for testing the setting state of the fuse element;

a selector which selectively outputs one of the test signal held in the test signal holding circuit and the setting state of the fuse element fetched by the latch circuit based on a select signal; and a select signal generation circuit which generates the select signal based on a test mode setting signal and the latch clock, wherein the latch circuit cyclically fetches the setting state of the fuse element based on the latch clock, and wherein the cyclic signal is one of a frame signal FR, a start pulse signal YD, and a latch pulse signal LP, which specifies one vertical scanning period or one horizontal scanning period and an alternating signal which is used for inverting a voltage applied to a liquid crystal, and wherein the select signal generation circuit generates the select signal so that the selector selectively outputs the setting state of the fuse element fetched by the latch circuit when the latch clock is input.

4. A display driver circuit comprising:

a fuse circuit which is used for adjusting an analog value based on a setting state of a fuse element; and a driver circuit which drives a display panel based on a voltage value or a current value adjusted based on the setting state and based on a cyclic signal, wherein the fuse circuit includes:

a latch circuit which stores the setting state of the fuse element; and a latch clock generation circuit which generates a latch clock based on the cyclic signal, the latch clock being used for fetching the setting state of the fuse element into the latch circuit, wherein the latch circuit cyclically fetches the setting state of the fuse element based on the latch clock.

5. The display driver circuit as defined in claim 4, wherein the analog value is a current value in the display driver circuit, voltage value in the display driver circuit, or oscillation frequency in the display driver circuit.

6. A display driver circuit comprising:

a fuse circuit which is used for adjusting an analog value based on a setting state of a fuse element; and a driver circuit which drives a display panel based on a voltage value or a current value adjusted based on the setting state and based on a cyclic signal, wherein the fuse circuit includes:

a latch circuit which stores the setting state of the fuse element, a latch clock generation circuit which generates a latch clock based on the cyclic signal, the latch clock being used for fetching the setting state of the fuse element into the latch circuit, a test signal holding circuit which holds a test signal for testing the setting state of the fuse element, a selector which selectively outputs one of the test signal held in the test signal holding circuit and the setting state of the fuse element fetched by the latch circuit based on a select signal; and a select signal generation circuit which generates the select signal based on a test mode setting signal and the latch clock, wherein the latch circuit cyclically fetches the setting state of the fuse element based on the latch clock, and wherein the select signal generation circuit generates the select signal so that the selector selectively outputs the setting state of the fuse element fetched by the latch circuit when the latch clock is input.

7. The display driver circuit as defined in claim 6, wherein the analog value is a current value in the display driver circuit, voltage value in the display driver circuit, or oscillation frequency in the display driver circuit.

* * * * *